US012563978B2

(12) United States Patent
Kim et al.

(10) Patent No.: US 12,563,978 B2
(45) Date of Patent: Feb. 24, 2026

(54) SUBSTRATE FOR EPITAXIALLY GROWING DIAMOND CRYSTAL AND METHOD OF MANUFACTURING DIAMOND CRYSTAL

(71) Applicant: ORBRAY CO., LTD., Tokyo (JP)

(72) Inventors: Seongwoo Kim, Tokyo (JP); Koji Koyama, Tokyo (JP)

(73) Assignee: ORBRAY CO., LTD., Tokyo (JP)

( * ) Notice: Subject to any disclaimer, the term of this patent is extended or adjusted under 35 U.S.C. 154(b) by 204 days.

(21) Appl. No.: 18/258,890

(22) PCT Filed: Dec. 23, 2021

(86) PCT No.: PCT/JP2021/047757
§ 371 (c)(1),
(2) Date: Jun. 22, 2023

(87) PCT Pub. No.: WO2022/138788
PCT Pub. Date: Jun. 30, 2022

(65) Prior Publication Data
US 2024/0052522 A1    Feb. 15, 2024

(30) Foreign Application Priority Data

Dec. 23, 2020    (JP) ................................ 2020-213483
Dec. 23, 2020    (JP) ................................ 2020-213490
Sep. 9, 2021    (JP) ................................ 2021-147187

(51) Int. Cl.
*C30B 25/18*        (2006.01)
*C30B 29/04*        (2006.01)
*H01L 21/02*        (2006.01)
(52) U.S. Cl.
CPC .......... *H01L 21/0242* (2013.01); *C30B 25/18* (2013.01); *C30B 29/04* (2013.01);
(Continued)

(58) Field of Classification Search
CPC ..... C30B 29/04; C30B 25/18; H01L 2/10242; H01L 21/02425; H01L 21/0243;
(Continued)

(56) References Cited

U.S. PATENT DOCUMENTS

2007/0084398 A1    4/2007    Schreck et al.

FOREIGN PATENT DOCUMENTS

DE        10320133 B4 *    2/2011    ........... C30B 25/105
EP        3358049 A1 *    8/2018    ......... C23C 16/0281
(Continued)

OTHER PUBLICATIONS

Request for Submission of Opinion for corresponding Korean application No. 10-2023-7025214; dated Jun. 25, 2024 (17 pages) Machine Translation.
(Continued)

*Primary Examiner* — Robert M Kunemund
(74) *Attorney, Agent, or Firm* — Mendelsohn Dunleavy, PC; Kevin J. Dunleavy

(57) ABSTRACT

Provided are a substrate for epitaxially growing a diamond crystal, having at least a surface made of a metal, in which the above surface made of the metal is a plane having an off angle φ of more than 0°, and the full width at half maximum of the X-ray diffraction peak from the (002) plane by the X-ray rocking curve measurement at the above surface made of the metal is 300 seconds or less; and a method of manufacturing a diamond crystal, including epitaxially growing a diamond crystal on the above surface made of the metal of the above substrate.

19 Claims, 7 Drawing Sheets

(52) U.S. Cl.
CPC .... *H01L 21/02425* (2013.01); *H01L 21/0243* (2013.01); *H01L 21/02433* (2013.01); *H01L 21/02491* (2013.01); *H01L 21/02527* (2013.01); *H01L 21/0262* (2013.01); *H01L 21/02658* (2013.01)

(58) Field of Classification Search
CPC ......... H01L 21/02433; H01L 21/02491; H01L 21/02527; H01L 21/0262; H01L 21/10242
See application file for complete search history.

(56) References Cited

FOREIGN PATENT DOCUMENTS

| JP | H11106290 | A | 4/1999 |
|----|-----------|---|--------|
| JP | 2005-219962 | A | 8/2005 |
| JP | 4769428 | B2 | 9/2011 |

OTHER PUBLICATIONS

International Search Report for corresponding International application No. PCT/JP2021/047757; dated Mar. 1, 2022 (10 pages) Machine Translation.

International Preliminary Report on Patentability for corresponding International application No. PCT/JP2021/047757; dated Jul. 6, 2023 (10 pages) Machine Translation.

Lee, Kee Han, et al. "Epitaxy of iridium on SrTiO3/Si (001): A promising scalable substrate for diamond heteroepitaxy." Diamond and Related Materials 66 (2016): 67-76.

Samoto, A., et al. "Investigation of heterostructure between diamond and iridium on sapphire." Diamond and Related Materials 17.7-10 (2008): 1039-1044.

Office action for corresponding Japanese application No. 2022-571600; dated Nov. 4, 2025 (7 pages). Machine Translation.

Extended european search report based on the corresponding European application No. 21910928.7 ; dated Aug. 10, 2024 (10 pages).

\* cited by examiner

SUBSTRATE FOR EPITAXIALLY GROWING DIAMOND CRYSTAL AND METHOD OF MANUFACTURING DIAMOND CRYSTAL

TECHNICAL FIELD

The present invention relates to a substrate for epitaxially growing a diamond crystal and a method of manufacturing a diamond crystal.

BACKGROUND ART

Diamond is expected as an ultimate semiconductor substrate (see, for example, PTL 1 and NPL 1). The reason for this is that diamond has a large number of excellent characteristics unprecedented as a semiconductor material such as a high thermal conductivity, a high electron mobility or positive hole mobility, a high dielectric breakdown electric field intensity, a low dielectric loss, and a wide bandgap.

[PTL 1] Japanese Patent No. 4769428

[NPL 1] A. Samoto et al., Investigation of heterostructure between diamond and iridium on sapphire, Diamond & Related Materials 17 (2008) 1039-1044

SUMMARY OF INVENTION

As the method of growing diamond, there is a method in which a diamond crystal is epitaxially grown (namely, heteroepitaxially grown) on the surface of a growing substrate including a different material from diamond. One example thereof is a method in which a diamond crystal is formed on the surface of an iridium (Ir) layer by a heteroepitaxial growth method, as described in PTL 1 and NPL 1. However, according to a study by the present inventors, it is considered to be difficult to epitaxially grow a high-quality diamond crystal with the method described in PTL 1 and the method described in NPL 1.

In view of the circumstances described up to this point, it is an object of the present invention to provide a new means for epitaxially growing a high-quality diamond crystal.

As a result of extensive research for achieving the object, the present inventors newly found that it becomes possible to obtain a high-quality diamond crystal by a substrate (which will be also hereinafter described as a "substrate for crystal growth" or simply a "substrate") for epitaxially growing a diamond crystal:

having at least a surface made of a metal, in which the above surface made of the metal is a plane having an off angle φ of more than 0°, and the full width at half maximum of the X-ray diffraction peak from the (002) plane by the X-ray rocking curve measurement at the above surface made of the metal is 300 seconds or less.

With the substrate for crystal growth in accordance with one aspect of the present invention, by epitaxially growing a diamond crystal on the surface made of the metal, it is possible to obtain a high-quality diamond crystal. As for this point, the present inventors presume as follows.

With the method described in PTL 1, on the surface of a single-crystal magnesium oxide (MgO) substrate of a just substrate whose surface is a (100) plane, an Ir layer is formed so that the surface becomes a (100) plane. PTL 1 discloses a method in which an ion irradiation layer is formed on the surface of the Ir layer, and a diamond film is heteroepitaxially grown on the surface of the ion irradiation layer. The just substrate is a substrate in which the surface of the underlying substrate is a just surface at an inclination angle of 0° from a desired crystal surface, and the (100) plane is assumed to be the surface in PTL 1.

However, with the heteroepitaxial growth by the method described in PTL 1, it is considered as follows: in the initial step of heteroepitaxially growing a diamond crystal on the ion irradiation layer, a crystal defect is caused upon integration of the diamond crystalline nuclei, resulting in the reduction of the crystallinity. When a just substrate is used for the underlying substrate, the process proceeds in a Volmer-Weber mode in which a diamond crystal grows in an island shape three-dimensionally. Therefore, it is presumed as follows: the growth flow directions are not fixed in one direction, so that diamond crystal grains are integrated all over, and crystal defects are formed at the integration parts (interfaces) generated in a large amount, resulting in the reduction of the crystallinity.

In addition, the present inventors confirmed as follows: when a diamond crystal is formed on the just substrate, a diamond crystal is spirally grown, resulting in the formation of a crystal defect.

In contrast to this, with the substrate for crystal growth described above, the surface of the metal layer on which a diamond crystal is epitaxially grown has an off angle φ of more than 0°. This point can contribute to enabling obtaining of a high-quality diamond crystal by the substrate for crystal growth.

On the other hand, NPL 1 concludes as follows: although a diamond film was attempted to be epitaxially grown on the surface of the Ir layer formed on a sapphire substrate having an off angle, the epitaxial area was very small; as a result of the measurement of the XRD spectrum, it was confirmed that diamond was not epitaxially grown (see left column, page 1043 of NPL 1). As for this point, the present inventors presumed that the low film quality of the Ir layer formed on the sapphire substrate in NPL 1 was the reason causing the result, and further conducted extensive research thereon. This consequently led to new finding of the following: the substrate for crystal growth having a surface made of a metal having an off angle φ of more than 0°, and a film quality of a full width at half maximum of the X-ray diffraction peak from the (002) plane by the X-ray rocking curve measurement of 300 seconds or less as the surface for epitaxially growing a diamond crystal enables obtaining of a high-quality diamond crystal.

In one embodiment, the above off angle φ can be 3° or more and 18° or less.

In one embodiment, the above metal can be a metal selected from the group consisting of group 8 elements, group 9 elements, and group 10 elements, and the above surface made of the metal can be a surface having the off angle φ in the <100> axis direction or the <110> axis direction with respect to the (100) plane.

In one embodiment, the above substrate has a metal layer on the underlying substrate, and the surface made of the metal can be the surface of the metal layer.

In one embodiment, the above underlying substrate can be a sapphire substrate, a Si substrate, a $SrTiO_3$ substrate, or a YSZ substrate.

In one embodiment, the surface of the above underlying substrate having the above metal layer can be a plane having an off angle θ of more than 0°.

In one embodiment, the above underlying substrate can be a sapphire substrate, and the surface of the above sapphire substrate having the above metal layer can be a plane having an off angle θ of more than 0° in the m axis or c axis direction with respect to the A plane, a plane having an off angle θ of more than 0° in the [−1101] axis or a axis direction with respect to the R plane, or a plane having an off angle θ of more than 0° in the a axis or c axis direction with respect to the M plane.

In one embodiment, the above off angle θ can be 3° or more and 20° or less.

In one embodiment, φ=(0.89 to 0.9)×θ+T (T: φ value for θ=0° or tolerance angle value at the time of setting θ=0°) can hold with respect to the above off angle θ.

In one embodiment, the substrate can have a plurality of terraces connected in a stepped shape on the above surface made of the metal.

One aspect of the present invention relates to a method of manufacturing a diamond crystal, including epitaxially growing a diamond crystal on the above surface made of the metal of the above substrate.

In one embodiment, the above substrate can have a plurality of steps and terraces on the above surface made of the metal, and the above manufacturing method can include epitaxially growing the diamond crystal in the plane direction of the terrace with the above step as a starting site of epitaxial growth of the crystal lattice array.

In accordance with one aspect of the present invention, it is possible to provide a substrate for epitaxially growing a diamond crystal, and capable of epitaxially growing a high-quality diamond crystal. Further, in accordance with one aspect of the present invention, it is possible to provide a method of manufacturing a diamond crystal, capable of manufacturing a high-quality diamond crystal using the above substrate.

DESCRIPTION OF EMBODIMENTS

[Substrate for Crystal Growth]

Figure 1:
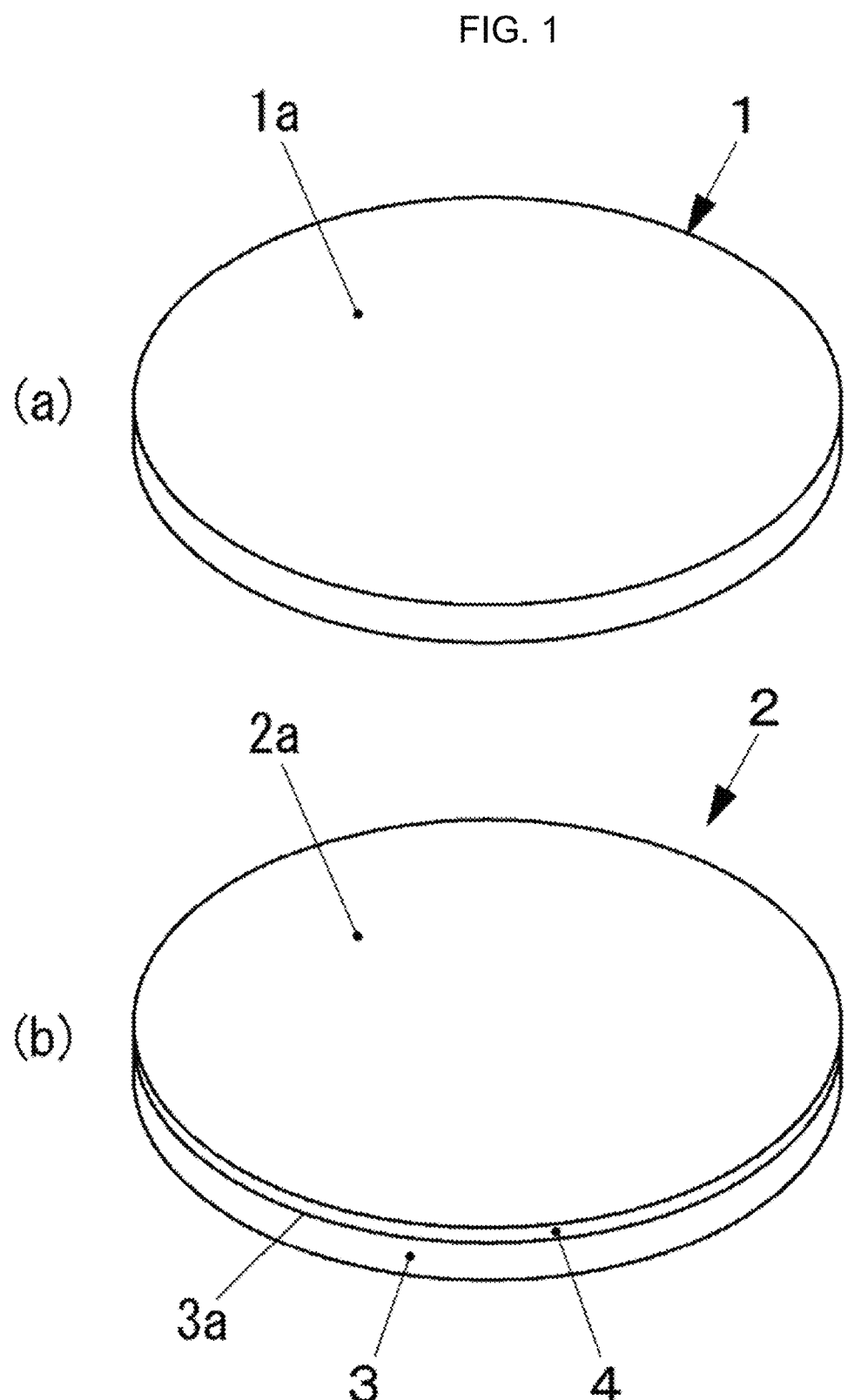
FIG. 1(a) is a perspective view showing one embodiment of a substrate for crystal growth (a bulk substrate made of a metal).
FIG. 1(b) is a perspective view showing one embodiment of a substrate for crystal growth (a substrate having an underlying substrate and a metal layer).

A substrate for crystal growth in accordance with one aspect of the present invention is a substrate for epitaxially growing a diamond crystal, and having at least a surface made of a metal. The above surface made of the metal is a plane having an off angle φ of more than 0°, and the full width at half maximum of the X-ray diffraction peak from the (002) plane by the X-ray rocking curve measurement at the above surface made of the metal is 300 seconds or less.

Below, the above substrate for crystal growth will be further described in details. Below, a description may be given by reference to the accompanying drawings. However, the present invention is not limited to the embodiments shown in the drawings.

The above substrate has at least a surface made of a metal. A diamond crystal can be epitaxially grown, namely, heteroepitaxially grown on such a surface made of a metal.

In one embodiment, the above substrate is a substrate made of a metal (a bulk substrate made of a metal), and the surface of the substrate made of a metal can be the above surface made of the metal. FIG. 1(a) shows one example of the substrate of such an embodiment (a perspective view). The surface 1a of a substrate 1 shown in FIG. 1(a) is the above surface made of the metal. The surface 1a is a plane forming the main surface of the substrate 1.

In another embodiment, the above substrate is a substrate having a metal layer on the underlying substrate. The surface of the metal layer can be the above surface made of the metal. FIG. 1(b) shows one example of the substrate of such an embodiment (a perspective view). A substrate 2 shown in FIG. 1(b) has a metal layer 4 on a surface 3a of an underlying substrate 3. The metal layer 4 is directly stacked on the surface 3a of the underlying substrate 3. The surface 2a of the metal layer 4 is the above surface made of the metal. The surface 2a is a plane forming the main surface of the substrate 2. The substrate having a metal layer on the underlying substrate can more suppress the amount of a metal to be used as compared with a bulk substrate made of a metal, and hence can suppress the manufacturing cost. This point is preferable from the viewpoint of manufacturing a large-size substrate as a substrate for crystal growth at a low cost. In FIG. 1(b), in order to put priority on ease of understanding of the drawing, the actual ratio of the thickness of the underlying substrate 3 and the thickness of the metal layer 4 is ignored.

The above metal can be one of, or an alloy of two or more of a metal selected from the group consisting of group 8 elements, group 9 elements, and group 10 elements, and is preferably one of the metals selected from the above group. As metals preferable from the viewpoint of reduction of the manufacturing cost among the metals, iridium (Ir), platinum (Pt), ruthenium (Ru), palladium (Pd), rhodium (Rh), and the like can be exemplified.

As for the substrate having a metal layer on the underlying substrate, the underlying substrate is preferably any of a sapphire substrate, a Si substrate, a $SrTiO_3$ substrate, or a YSZ (yttria stabilized zirconia) substrate from the viewpoint of being able to obtain a large-sized underlying substrate at a low cost. From the viewpoint of the chemical stability and the viewpoint of ease for setting the off angle θ by polishing as described later, the underlying substrate is preferably a sapphire substrate.

In any of the above embodiments, the above surface made of the metal at the substrate for crystal growth is a plane having an off angle φ of more than 0°. Such a plane is generally referred to as an "off plane". The off plane is an inclined plane having an off angle (inclination angle) φ (provided that φ does not include 0°) from a just plane having a desired crystal face orientation.

The above surface made of the metal (off plane) can have a plurality of steps and terraces, and particularly, can have a plurality of terraces connected in a stepped shape.

Figure 2:
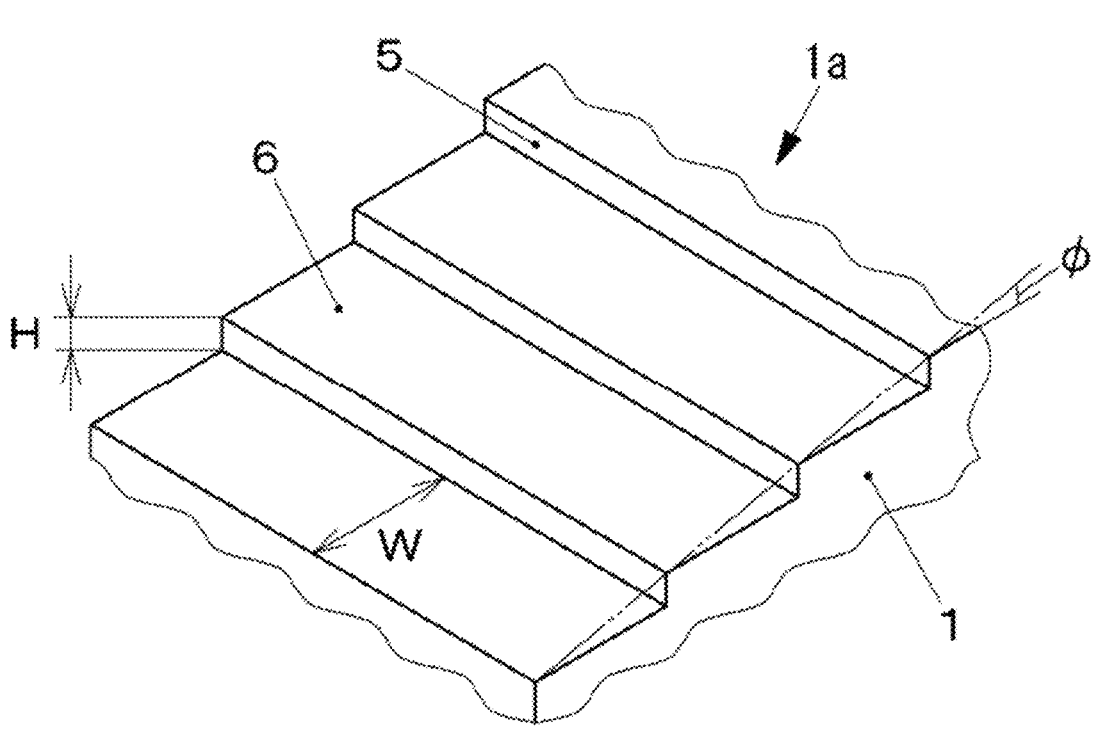
FIG. 2 is a perspective view schematically showing terraces formed connected in a stepped shape on the surface of the substrate for crystal growth shown in FIG. 1(a).
Figure 4:
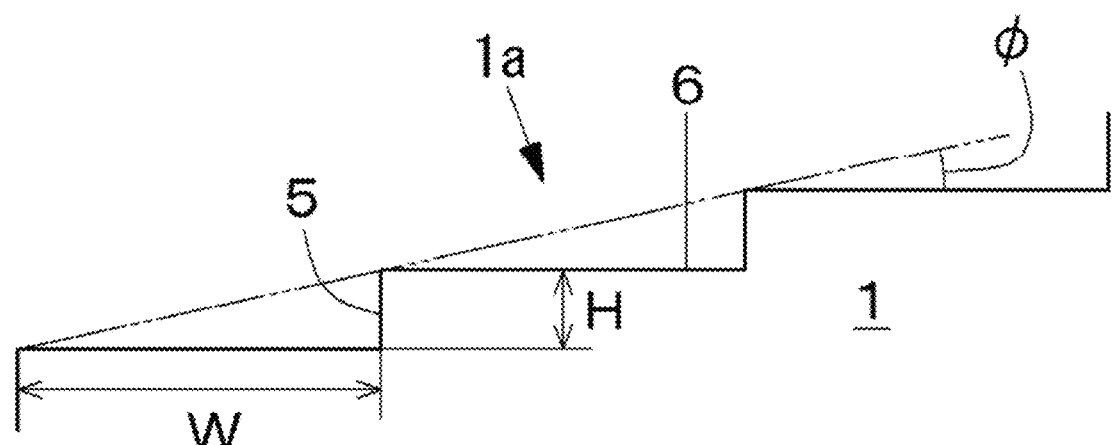
FIG. 4 is a side view of FIG. 2.

FIG. 2 is a perspective view schematically showing the terraces formed connected in a stepped shape on the surface 1a of the substrate 1 shown in FIG. 1(a). FIG. 4 is a side view of FIG. 2.

Figure 3:
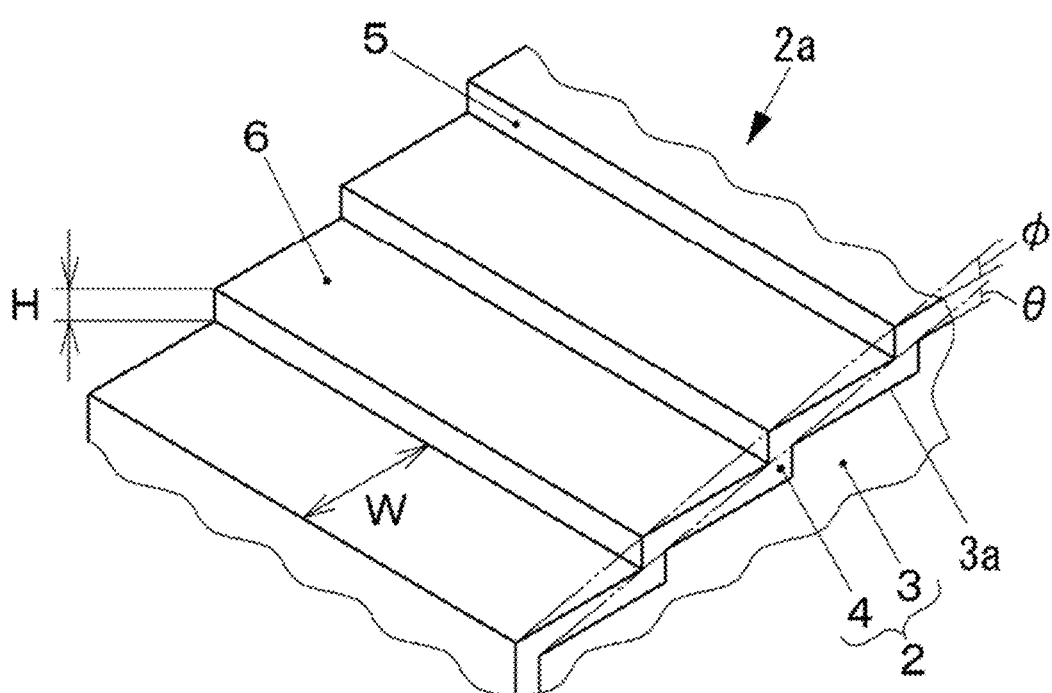
FIG. 3 is a perspective view schematically showing terraces formed connected in a stepped shape on the surface of the single crystal substrate for crystal growth shown in FIG. 1(b).
Figure 5:
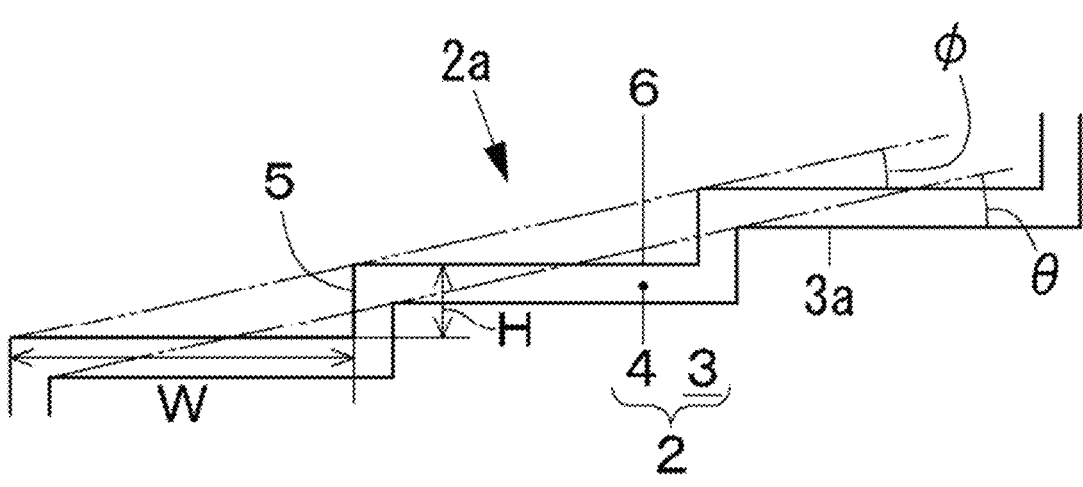
FIG. 5 is a side view of FIG. 3.

FIG. 3 is a perspective view schematically showing the terraces formed connected in a stepped shape on the surface 2a of the substrate 2 shown in FIG. 1(b). FIG. 5 is a side view of FIG. 3.

The surfaces 1a and 2a include a plurality of terraces 6 and steps 5 and have an off angle φ as shown in the respective drawings.

The respective terraces 6 are formed by connecting the elements of the above metal in a flat and stepped shape at an atomic level. The stepped terraces 6 spontaneously appear, indicating that the atoms of the metal element are neatly arrayed. Further, the atomic level of the step height H is a single step for one atom of the metal element forming the surface 1a or 2a, or a multi-step for two or more atoms thereof. The terrace width W and the step height H are determined according to the off angle φ.

Figure 6:
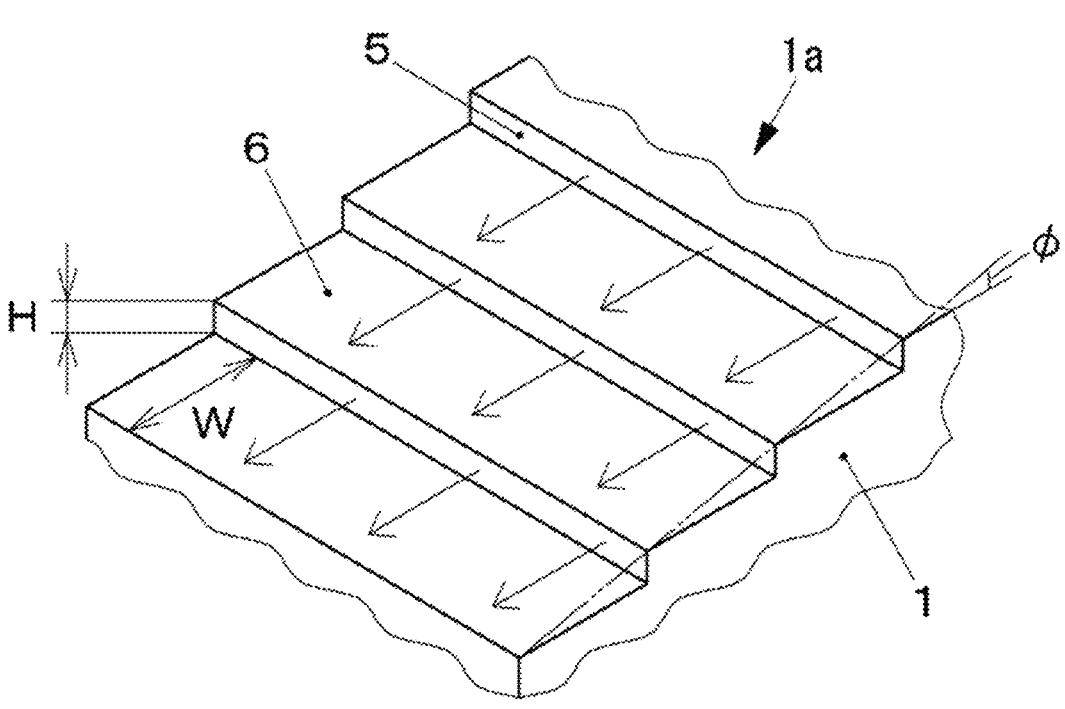
FIG. 6 is a perspective view schematically showing a state in which a diamond crystal undergoes step-flow growth from each step shown in FIG. 2.

FIG. 6 is a perspective view schematically showing a state in which a diamond crystal undergoes step-flow growth from each step shown in FIG. 2.

Figure 7:
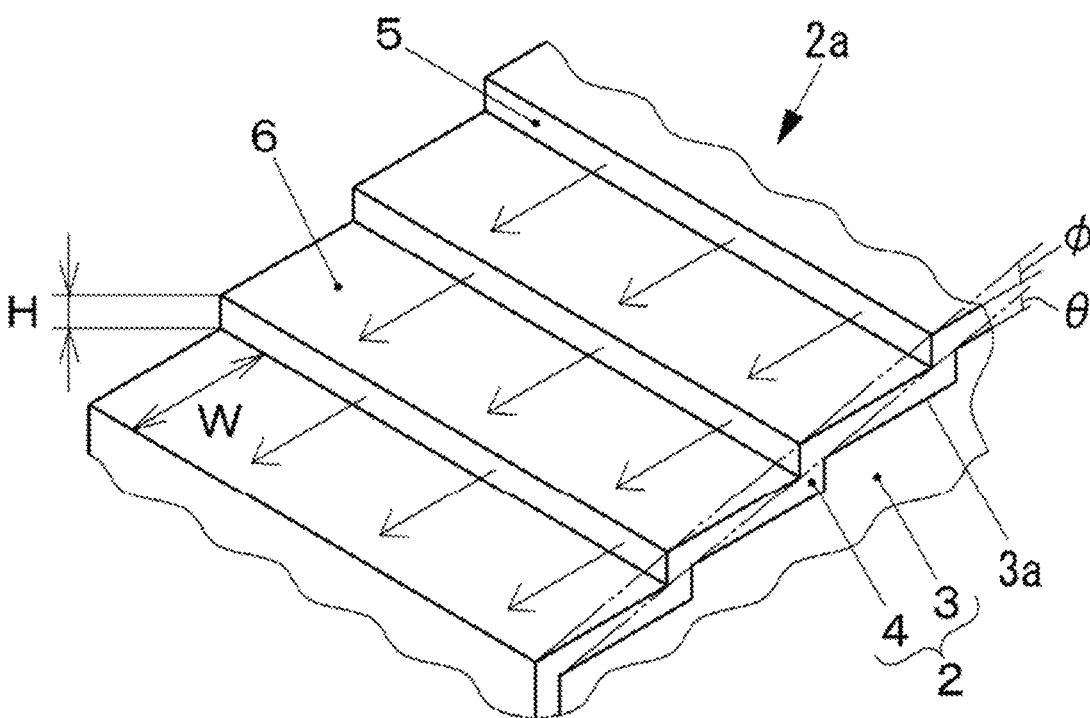
FIG. 7 is a perspective view schematically showing a state in which a diamond crystal undergoes step-flow growth from each step shown in FIG. 3.

FIG. 7 is a perspective view schematically showing a state in which a diamond crystal undergoes step-flow growth from each step shown in FIG. 3.

In manufacturing of a diamond crystal having the surface 1a or 2a as a to-be-grown plane, the step 5 can be the starting site for epitaxial growth of the crystal lattice array of the diamond crystal. Therefore, the growth progress direction of the diamond crystal can be two-dimensionally aligned in the plane direction of the terrace 6 as indicated with arrows (respective arrows with the step 5 as the starting point) in FIG. 6 or FIG. 7. The crystal growth in which the growth progress directions of a diamond crystal are thus aligned in one direction is referred to as step-flow growth. The growth flow directions of a diamond crystal on the surface 1a or 2a are fixed in one direction, and the step-flow growth is promoted, thereby enabling the improvement of the orientation alignment degree of the diamond crystal. As a result, it is possible to suppress the formation of a crystal defect at the interface at the time of integration of diamond crystal streams. As a result of this, it becomes possible to suppress the reduction of the crystallinity of the diamond crystal. Further, the growth flow directions are fixed in one direction, thereby suppressing the spiral growth of the diamond crystal. For this reason, the formation of a crystal defect is suppressed. This also enables the suppression of the reduction of the crystallinity of the diamond crystal.

The off angle φ can be set arbitrarily within the range of more than 0°. As previously described in details, in the above substrate for crystal growth, the surface, which is made of a metal and on which a diamond crystal is to be epitaxially grown, has an off angle φ of more than 0°. This can contribute to enabling of obtaining a high-quality diamond crystal by the above substrate for crystal growth. The off angle φ is preferably 3° or more and 29° or less, more preferably 3° or more and 18° or less, further preferably 3° or more and 15° or less, and still further preferably 3° or more and 10° or less. The formation of the surface made of a metal so as to have an off angle φ within the above range can contribute to the improvement of the film quality of the surface made of a metal. Further, setting of the off angle φ within the above range can reduce the roughness of the above surface made of the metal, and enables suppression of the surface roughness Ra at, for example, less than 3.5 nm. The surface roughness Ra can be, for example, 0.5 nm or more and can be less than this. The surface roughness Ra can be measured by means of a known surface roughness measuring device. Further, the off angle φ of the above surface made of the metal falls within the range, which enables the growth rate of a diamond crystal to be epitaxially grown to be made faster. For example, it becomes possible to implement a growth rate of 18 μm/h or more.

The above surface made of the metal of the above substrate for crystal growth becomes the to-be-grown plane on which a diamond crystal is heteroepitaxially grown. From the viewpoint of ease of control of the crystal growth direction of a diamond crystal and from the viewpoint of the optimization of the film quality (e.g., the crystallinity) and the surface roughness of the to-be-grown plane in the application of heteroepitaxial growth of a diamond crystal, the above surface made of the metal is preferably a plane (an inclined plane) having the off angle φ in the <100> axis direction or the <110> axis direction with respect to the (100) plane.

At the surface 3a of the underlying substrate 3 shown in FIG. 3, the off angle θ (provided that θ does not include 0°) is formed. When the underlying substrate 3 is a sapphire substrate, the surface 3a having the metal layer 4 thereon is preferably a plane (an inclined plane) having an off angle θ of more than 0° in the m axis or the c axis direction with respect to the A plane, a plane (an inclined plane) having an off angle θ of more than 0° in the [−1101] axis or the a axis direction with respect to the R plane, or a plane (an inclined plane) having an off angle θ of more than 0° in the a axis or the c axis direction with respect to the M plane. The underlying substrate 3 is assumed to be made of a sapphire, and further the crystal face orientation and the inclined axis direction of the surface 3a are set at any of the foregoing. This is preferable from the viewpoint of optimizing the crystal face orientation and the inclined axis direction in the application of epitaxial growth application of a diamond crystal, and thereby enabling control of the growth direction of the diamond crystal.

The off angle θ is preferably 3° or more and 29° or less, more preferably 3° or more and 20° or less, further preferably 3° or more and 15° or less, and still more preferably 3° or more and 10° or less. The reason for this is that setting of θ within the above range enables a further improvement of the crystallinity of a diamond crystal to be epitaxially grown on the surface 2a.

At the above substrate for crystal growth, the full width at half maximum (FWHM) of the X-ray diffraction peak from the (002) plane by the X-ray rocking curve measurement at the above surface made of the metal is 300 seconds or less. As a result of extensive research by the present inventors, it has been newly found as follows: the to-be-grown plane, on which a diamond crystal is to be epitaxially grown, has the above film quality; this can contribute to the improvement of the crystal quality of a diamond crystal formed on such a to-be-grown plane. The above FWHM can be, for example, 100 seconds or more or 150 degree seconds or more. A smaller value results in a higher film quality, and is preferable. For this reason, the value can be smaller than the values herein exemplified. For the unit of FWHM, "second" is also generally expressed as "arcsec".

With the above substrate for crystal growth, setting the above surface made of the metal as the to-be-grown plane enables epitaxial growth of a high-quality diamond crystal. For the crystal quality of such a diamond crystal, the full width at half maximum (FWHM) of the diffraction peak from the diamond (004) plane at the X-ray rocking curve measurement can be, for example, 220 seconds or less, and/or the full width at half maximum (FWHM) of the diffraction peak from the diamond (311) plane can be, for example, 600 seconds or less.

Below, one example of the method of manufacturing the above substrate for crystal growth will be described.

The substrate 1 (bulk substrate made of a metal) shown in FIG. 1 can be manufactured by, for example, the following method.

First, a substrate made of a metal is prepared. As the metals forming the substrate, one or an alloy of two or more of the metal selected from the group consisting of group 8 elements, group 9 elements, and group 10 elements can be exemplified. The detail thereof is as described previously.

Then, on the surface of the above substrate made of a metal, the off angle $\varphi$ is formed. As the method of forming the off angle $\varphi$, examples can include loose abrasive grain polishing using a slurry. Examples of the slurry can include a slurry containing a diamond abrasive grain. As the grinder, a commercially available grinder can be used. Using a slurry and a grinder, for example, the substrate made of a metal is held at a polishing jig so as to achieve an off angle $\varphi$ of more than 0° from the crystal plane of the (100) plane. The grinder is pressed against the surface of the substrate made of a metal, thereby performing polishing. The inclined axis direction of the off angle $\varphi$ can be set at, for example, an inclination from the (100) plane in the <100> axis direction or <110> when the plane orientation of the surface is a (100) plane. The off angle $\varphi$ is as described previously.

The substrate 2 shown in FIG. 2 (the substrate having the metal layer 4 on the underlying substrate 3) can be manufactured by, for example, the following method. The manufacturing steps overlapping those of manufacturing the substrate 1 will not be described, or described in a simplified manner.

In manufacturing of the substrate 2, as the pre-step of manufacturing the substrate 2 having a surface made of a metal, the underlying substrate 3 is prepared. The underlying substrate 3 can be manufactured by, for example, first preparing a base material of the underlying substrate 3, and forming the outward shape thereof in a substrate shape. The base material of the underlying substrate 3 can be, for example, a bulk-body base material including any of sapphire, Si, SrTiO$_3$, or YSZ.

When the underlying substrate 3 includes sapphire, from the viewpoint of being an inclined plane which may cause step-flow growth, the surface 3a of the underlying substrate 3 can be set as any of an inclined plane having an off angle $\theta$ formed in the m axis or the c axis direction for the A plane, an inclined plane having an off angle $\theta$ formed in the [−1101] axis or the a axis direction for the R plane, or an inclined plane having an off angle $\theta$ formed in the a axis or the c axis direction for the M plane. The off angle $\theta$ of the underlying substrate 3 is as described previously. As the method of forming the off angle $\theta$, examples can include loose abrasive grain polishing using a slurry. For such polishing, the previous description can be referred.

Then, the metal layer 4 is formed on the surface 3a. As the metal forming the metal layer, one or an alloy of two or more of metals selected from the group consisting of group 8 elements, group 9 elements, and group 10 elements can be exemplified. The detail thereof is as described previously.

As the method of forming the metal layer 4, examples can include a magnetron sputtering method with the above metal as s target. The magnetron sputtering method can be the high frequency (RF) magnetron sputtering method or the direct-current (DC) magnetron sputtering method. The film thickness of the metal layer to be formed can be set at, for example, 1.0 μm or more and 2.0 μm or less. In contrast, the film thickness of the Ir layer formed on the sapphire substrate in NPL 1 previously described is 200 nm (see Table 2 of the same literature). The metal layer with a very thin thickness is thus low in film quality. Whereas, the present inventors presume that the formation of the metal layer with a relatively large thickness, for example, within the above range, can contribute to the improvement of the film quality of the metal layer to be formed. On the surface 2a of the metal layer 4 deposited and formed on the surface 3a having an off angle $\theta$, as shown in FIG. 3 and FIG. 5, the terraces 6 appear in a stepped shape with the off angle $\varphi$ without requiring performing of a polishing treatment subsequently. Further, as for the off angle $\varphi$ formed on the surface 2a made of a metal (i.e., the surface of the metal layer 4), the relationship of the linear regression equation of $\varphi=(0.89$ to $0.9)\times\theta+T$ can hold with respect to the off angle $\theta$ included in the surface 3a of the underlying substrate 3. T is the $\varphi$ value for $\theta=0°$ or the tolerance angle value of the $\varphi$ value at the time of setting $\theta=0°$, Thus, $\varphi$ can be linked by the linear regression equation of $\theta$. This is preferable from the viewpoint of ease of control of the $\varphi$ value with respect to the $\theta$ value. As described previously, the off angle $\varphi$ is preferably 3° or more and 18° or less. The inclined axis direction of the off angle $\varphi$ can be set at an inclination from (100) plane in the <100> axis direction or the <110> axis direction when the plane orientation of the surface 2a is the (100) plane.

[Method of Manufacturing Diamond Crystal]

One aspect of the present invention relates to a method of manufacturing a diamond crystal including epitaxially growing a diamond crystal on the above surface made of the metal of the above substrate for crystal growth.

A diamond crystal is heteroepitaxially grown, for example, on the above surface made of the metal by CVD (Chemical Vapor Deposition) under the step-flow growth conditions. As CVD, a known method is applicable. Examples thereof can include microwave plasma CVD, direct current plasma CVD, hot filament CVD and the like.

When the above surface made of the metal has a plurality of terraces connected in a stepped shape as described previously, a diamond crystal can be epitaxially grown in the plane direction of the terrace with the step as the starting site for epitaxial growth of a crystal lattice array. Namely, in the heteroepitaxial growth, the step 5 becomes the starting site for a diamond crystal to be epitaxially grown. As a result of this, the growth progress directions of a diamond crystal can be two-dimensionally aligned in the plane direction of the terrace 6 as indicated with an arrow (each arrow with the step 5 as the starting point) in FIG. 6 or FIG. 7. The thickness of the diamond crystal to be epitaxially grown can be set at a thickness equal to or larger than a thickness enough to fill the step 5. The step 5 is preferably formed perpendicular with respect to the growth progress direction of a diamond crystal (each arrow with the step 5 as the starting point in FIG. 6 or FIG. 7), and with mutual steps 5 in parallel with each other. The reason for this is as follows: progress of the step-flow growth becomes uniform, and the crystal lattice array is uniformalized, which suppresses the reduction of the crystallinity of a diamond crystal.

The diamond crystal to be grown and formed is any of a single crystal or a polycrystal, and the crystal may contain an impurity and/or a dopant. Further, the surface (the surface opposite to the side opposed to the surface 1*a* or 2*a*) of a diamond crystal is preferably a crystal plane of any of (100) or (110) in consideration of the versatility.

EXAMPLES

Below, the present invention will be described based on Examples.

However, the present invention is not limited to the embodiments shown in Examples. Further, the part overlapping the embodiments described previously will not be described, or described in a simplified manner.

As for the X-ray rocking curve measurement described below, the following measurement conditions were adopted.
Bulb: Cu
Applied voltage: 45 kV
Applied current: 40 mA
Scanning speed: 0.61°/min
Divergence slit width: 1 mm
Scattering slit/receiving slit: None
Kind of monochrometer: Ge220 symmetric-four crystal

Example 1

<Manufacturing of Substrate for Crystal Growth>
As shown in FIG. 1(*b*), FIG. 3, and FIG. 5, the substrate for crystal growth 2 including the underlying substrate 3 and the metal layer 4 was manufactured by the method described below.

The underlying substrate 3 was manufactured which was made of sapphire, and had an inclined plane formed at an off angle θ of 10° in the c axis direction with respect to the A plane as the surface 3*a*. The off angle θ was formed by loose abrasive grain polishing using a slurry.

By the magnetron sputtering method with iridium (Ir) as a target, an iridium layer with a film thickness of 1.0 μm or more and 2.0 μm or less was deposited on the surface 3*a*. The surface 2*a* of the deposited iridium layer (metal layer) 4 was a plane having a plurality of terraces connected in a stepped shape, and having the off angle φ described in Table 1 in the <110> axis direction with respect to the (100) plane.

For the surface 2*a*, the full width at half maximum (FWHM) of the X-ray diffraction peak from the (002) plane was determined by the X-ray rocking curve measurement.
<Epitaxial Growth of Diamond Crystal>
On the surface 2*a* of the substrate 2 manufactured as described above, a diamond crystal was heteroepitaxially grown under the step-flow growth conditions by direct current plasma CVD. The thickness of the diamond crystal to be heteroepitaxially grown was set at a thickness equal to or larger than the thickness enough to fill the step 5. As the conditions for step-flow growth by direct current plasma CVD, the substrate temperature was set at 1000° C.; the CVD furnace internal pressure, at 100 Torr; the hydrogen gas flow rate, as 475 sccm; and the methane gas flow rate, as 25 sccm.

The surface of the diamond crystal thus formed (the surface opposite to the side opposed to the surface 2*a* of the substrate 2, namely, the outermost surface of the diamond crystal) was the (100) plane.

Examples 2 to 8

<Manufacturing of Substrate for Crystal Growth>
As shown in Table 1, the substrate for crystal growth 2 was manufactured by the method described for Example 1, except for changing the inclined axis direction and/or the off angle θ with respect to the A plane as shown in Table 1.

In the manufactured substrate 2, the surface 2*a* of the iridium layer was the plane having a plurality of terraces connected in a stepped shape, having a plurality of terraces connected in a stepped shape, and having the off angle θ described in Table 1 in the <110> axis direction with respect to the (100) plane.

For each surface 2*a* of the respective manufactured substrates 2, the full width at half maximum (FWHM) of the X-ray diffraction peak from the (002) plane was determined by the X-ray rocking curve measurement.
<Epitaxial Growth of Diamond Crystal>
On each surface 2*a* of the manufactured substrates 2, a diamond crystal was heteroepitaxially grown by the method described for Example 1.

The surface of the diamond crystal thus formed (the surface opposite to the side opposed to the surface 2*a* of the substrate 2, namely, the outermost surface of the diamond crystal) was the (100) plane.

The above results are shown in Table 1.

TABLE 1

| | Underlying substrate | | | |
| | Inclined axis direction with respect to A plan | Off angle θ | Off angle φ | FWHM |
|---|---|---|---|---|
| Example 1 | C axis direction | 10° | 9.27° | 225 seconds |
| Example 2 | c axis direction | 7° | 6.60° | 248 seconds |
| Example 3 | c axis direction | 5° | 4.82° | 258 seconds |
| Example 4 | c axis direction | 3° | 3.04° | 288 seconds |
| Example 5 | m axis direction | 10° | 9.27° | 253 seconds |
| Example 6 | m axis direction | 7° | 6.60° | 247 seconds |
| Example 7 | m axis direction | 5° | 4.82° | 272 seconds |
| Example 8 | m axis direction | 3° | 3.04° | 276 seconds |

Comparative Example 1

The substrate for crystal growth 2 was manufactured by the method described for Example 1, except for using, as the underlying substrate 3, an underlying substrate which was made of sapphire and an A plane just substrate (θ=0°). In the manufactured substrate 2, the surface 2*a* of the iridium layer was a just plane (φ=) 0°.

For the surface 2*a*, the full width at half maximum (FWHM) of the X-ray diffraction peak from the (002) plane was determined by the X-ray rocking curve measurement, and was found to be about 400 seconds.

On the surface 2a of the substrate 2 manufactured as described above, a diamond crystal was heteroepitaxially grown by the method described for Example 1.

Comparative Example 2

The substrate for crystal growth 2 was manufactured by the method described for Example 1, except for setting the film thickness of the iridium layer to be deposited at 200 nm as with the Ir layer described in NPL 1 in deposition of the iridium layer.

In the manufactured substrate 2, the surface 2a of the iridium layer was the plane having the same off angle φ as that of Example 1 in the <110> axis direction with respect to the (100) plane.

For the surface 2a, the full width at half maximum (FWHM) of the X-ray diffraction peak from the (002) plane was determined by the X-ray rocking curve measurement, and was found to be about 950 seconds.

Although an attempt was made to heteroepitaxially grow a diamond crystal on the surface 2a of the substrate 2 manufactured as described above by the method described for Example 1, the diamond crystal could not be epitaxially grown as with the results described in NPL 1.

Figure 9:
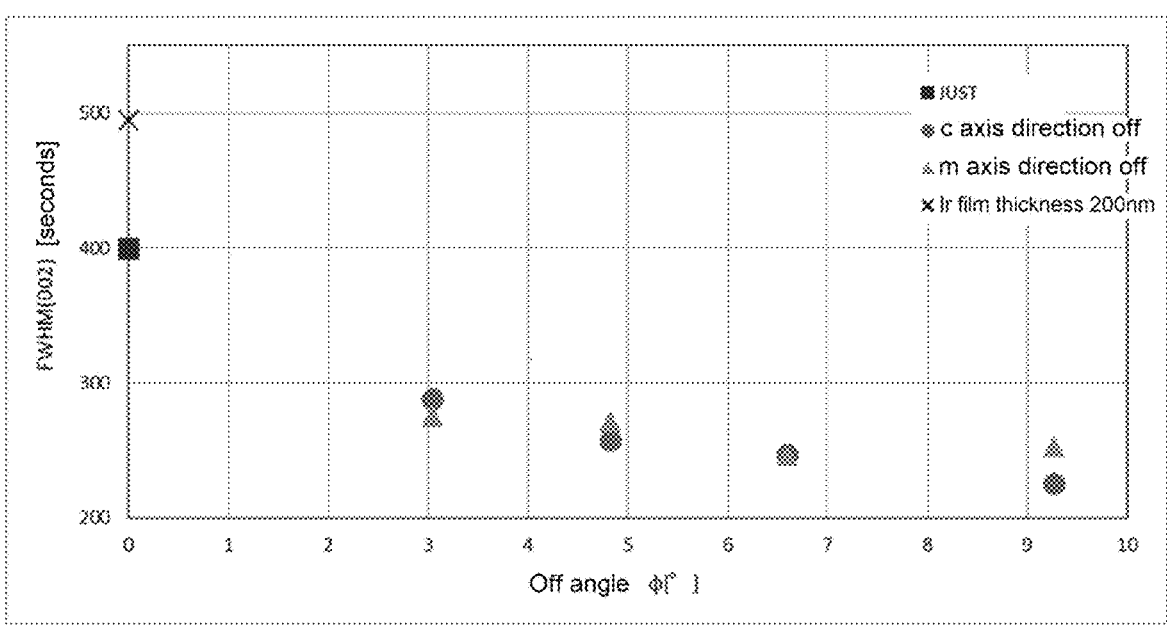
FIG. 9 is a graph showing the full width at half maximum (FWHM) measured at the surface made of a metal of each substrate for crystal growth of Examples and Comparative Examples.

FIG. 9 shows the values of FWHM determined for the substrate surfaces 2a of Examples 1 to 8, Comparative Example, 1, and Comparative Example 2 all together. In FIG. 9, the plots of the "c axis direction off" represent the measurement results of Examples 1 to 4, the plots of the "m axis direction off" represent the measurement results of Examples 5 to 8, the plot of the "JUST" represents the measurement result of Comparative Example 1, and the plot of the "Ir film thickness 200 nm" represents the measurement result of Comparative Example 2.

As the evaluation of the crystallinity (crystal quality) of each diamond crystal formed in Examples 1 to 8 and Comparative Example 1, the X-ray rocking curve measurement was performed for each diamond crystal. With the X-ray rocking curve measurement, the X-ray diffraction peak from the diamond (004) plane was determined. For Examples 1 to 4 and Comparative Example 1, with the X-ray rocking curve measurement, the full width at half maximum (FWHM) of the X-ray diffraction peak from the diamond (311) plane was also determined. The obtained results are shown in FIG. 10 and FIG. 11.

Figure 10:
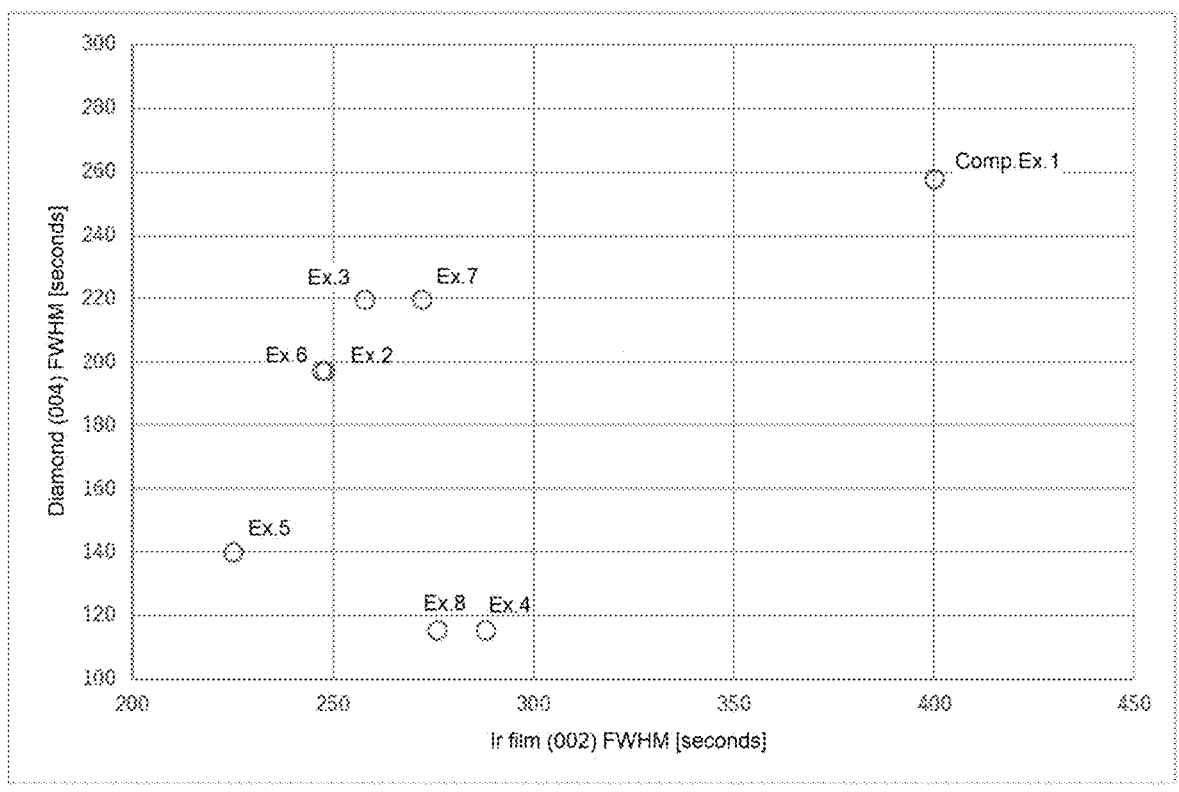
FIG. 10 is a graph showing the full width at half maximum (FWHM) measured at the surface of a diamond crystal formed by epitaxial growth on the surface made of a metal of each substrate for crystal growth of Examples and a Comparative example.

FIG. 10 is a graph obtained by plotting the full width at half maximum (FWHM) of the X-ray diffraction peak from each diamond (004) plane obtained for Examples 2 to 8 and Comparative Example 1 with respect to the value of FWHM (in FIG. 10, "Ir film (002) FWHM") determined for the substrate surface 2a.

Figure 11:
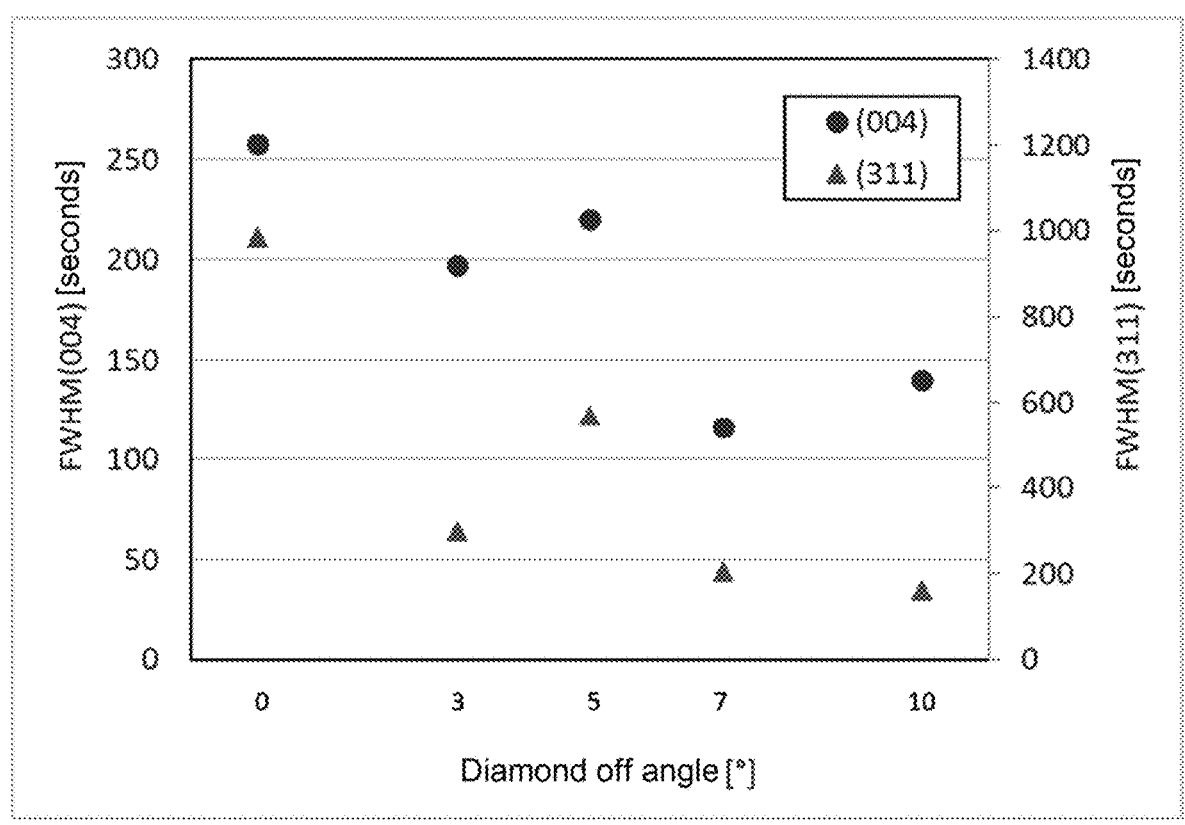
FIG. 11 is a graph showing the full width at half maximum (FWHM) measured at the surface of a diamond crystal formed by epitaxial growth on the surface made of a metal of each substrate for crystal growth of Examples and Comparative Example.

FIG. 11 shows the full width at half maximum (FWHM) of the X-ray diffraction peak from the diamond (004) plane, and the full width at half maximum (FWHM) of the X-ray diffraction peak from the diamond (311) plane for Examples 1 to 4 and Comparative Example 1.

From the results shown in FIG. 10 and FIG. 11, it can be confirmed as follows: by using the substrates for crystal growth of Examples, it was possible to epitaxially grow a diamond crystal having a crystallinity showing a full width at half maximum (FWHM) of the X-ray diffraction peak of 220 seconds or less for the X-ray diffraction peak from the diamond (004) plane, and it was possible to epitaxially grow a diamond crystal having crystallinity showing a full width at half maximum (FWHM) of the X-ray diffraction peak of 600 seconds or less for the X-ray diffraction peak from the diamond (311) plane.

Figure 8:
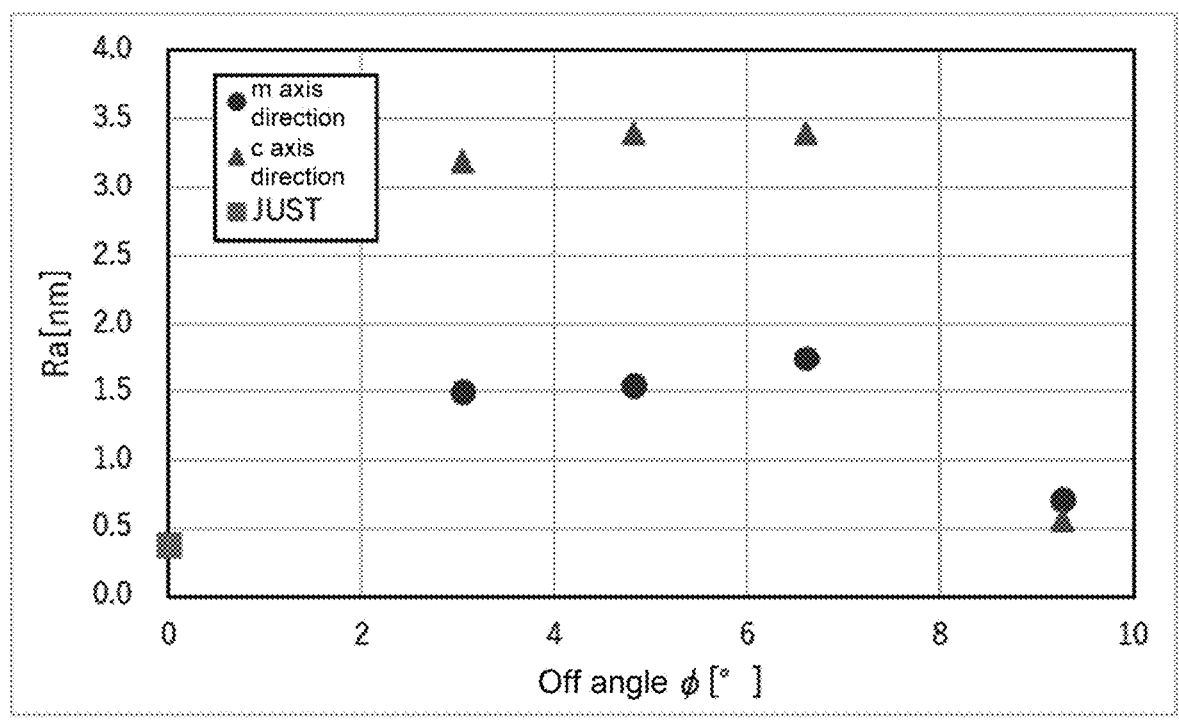
FIG. 8 is a graph showing the measurement results of the surface roughness Ra measured at the surface made of a metal of each substrate for crystal growth of Examples and Comparative Example.

FIG. 8 shows the surface roughness Ra determined by the measurement under the following measurement conditions for the surface 2a of each substrate for crystal growth of Examples 1 to 8 and Comparative Example 1. In FIG. 8, the plots of the "c axis direction" represent the measurement results of Examples 1 to 4, the plots of the "m axis direction" represent the measurement results of Examples 5 to 8, and the plot of the "JUST" represents the measurement result of Comparative Example 1.

Measuring device: Hitachi High-Tech Science Corporation atomic force microscope L-trace Measurement area: 5 μm×5 μm Scanning frequency: 0.6 Hz From the results shown in FIG. 8, it can be confirmed that in each substrate for crystal growth of Examples 1 to 8, the surface 2a serving as the to-be-grown plane in epitaxial growth of a diamond crystal is a plane having a surface roughness Ra of less than 3.5 nm, and having high smoothness.

Figure 12:
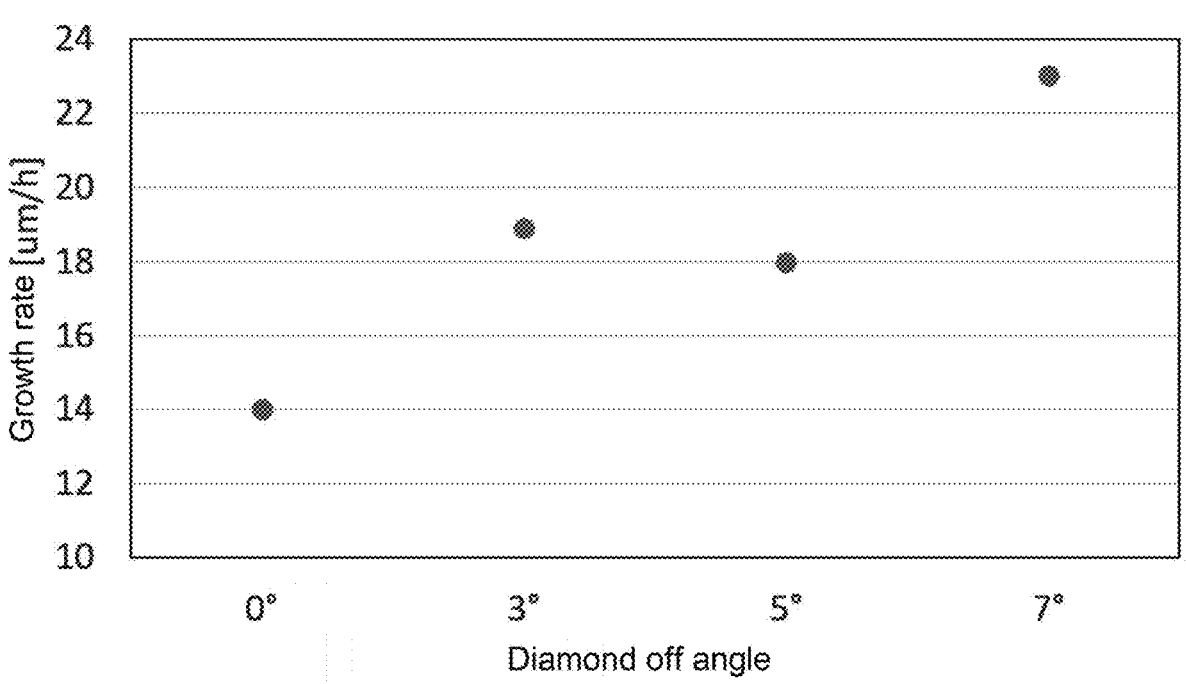
FIG. 12 is a graph showing the growth rate of epitaxial growth of a diamond crystal at the surface made of a metal of each substrate for crystal growth of Examples and Comparative Example.

FIG. 12 shows the growth rate of each diamond crystal in Examples 2 to 4 and Comparative Example 1. As shown in FIG. 12, while the growth rate of Comparative Example 1 (off angle 0°) was 14 μm/h, a diamond crystal could be epitaxially grown at a growth rate of 18 μm/h or more in Examples.

REFERENCE SIGNS LIST

1, 2 Substrate for crystal growth
1a, 2a Surface made of a metal
3 Underlying substrate
3a Surface of underlying substrate
4 Metal layer
5 Step
6 Terrace
H Step height
W Terrace width
φ, θ Off angle

The invention claimed is:

1. A substrate for epitaxially growing a diamond crystal, which comprises
   at least a surface made of a metal, and
   a plurality of terraces connected in a stepped shape on the surface made of the metal, wherein the surface made of the metal is a plane having an off angle φ of more than 0°, and a full width at half maximum of an X-ray diffraction peak from a (002) plane by an X-ray rocking curve measurement at the surface made of a metal is 300 seconds or less.

2. The substrate according to claim 1, wherein the off angle φ is 3° or more and 18° or less.

3. The substrate according to claim 1, wherein the metal is a metal selected from the group consisting of group 8 elements, group 9 elements, and group 10 elements, and the surface made of the metal is a surface having the off angle φ in a <100> axis direction or a <110> axis direction with respect to a (100) plane.

4. The substrate according to claim 1, wherein the substrate has a metal layer on an underlying substrate, and the surface made of the metal is a surface of the metal layer.

5. The substrate according to claim 4, wherein the underlying substrate is a sapphire substrate, a Si substrate, a SrTiO₃ substrate, or a YSZ substrate.

6. The substrate according to claim 4, wherein a surface of the underlying substrate having the metal layer is a plane having an off angle θ of more than 0°.

7. The substrate according to claim 4, wherein the underlying substrate is a sapphire substrate, and a surface of the sapphire substrate having the metal layer is:

a plane having an off angle θ of more than 0° in an m axis or c axis direction with respect to an A plane, a plane having an off angle θ of more than 0° in a [−1101] axis or a axis direction with respect to an R plane, or a plane having an off angle θ of more than 0° in an a axis or c axis direction with respect to an M plane.

8. The substrate according to claim 6, wherein the off angle θ is 3° or more and 20° or less.

9. The substrate according to claim 6, wherein φ=(0.89 to 0.9)×θ+T (T: φ value for θ=0° or tolerance angle value at the time of setting θ=0°) holds with respect to the off angle θ.

10. A method of manufacturing a diamond crystal, which comprises epitaxially growing a diamond crystal on the surface made of the metal of the substrate according to claim 1.

11. A method of manufacturing a diamond crystal according to claim 10, wherein the substrate comprises a plurality of steps and terraces on the surface made of the metal, and the method comprises epitaxially growing the diamond crystal in a plane direction of the terrace with the step as a starting site of epitaxial growth of a crystal lattice array.

12. The substrate according to claim 2, wherein the metal is a metal selected from the group consisting of group 8 elements, group 9 elements, and group 10 elements, and the surface made of the metal is a surface having the off angle φ in a <100> axis direction or a <110> axis direction with respect to a (100) plane.

13. The substrate according to claim 2, wherein the substrate has a metal layer on an underlying substrate, and the surface made of the metal is a surface of the metal layer.

14. The substrate according to claim 12, wherein the substrate has a metal layer on an underlying substrate, and the surface made of the metal is a surface of the metal layer.

15. The substrate according to claim 13, wherein the underlying substrate is a sapphire substrate, a Si substrate, a SrTiO$_3$ substrate, or a YSZ substrate.

16. The substrate according to claim 14, wherein the underlying substrate is a sapphire substrate, a Si substrate, a SrTiO$_3$ substrate, or a YSZ substrate.

17. The substrate according to claim 5, wherein a surface of the underlying substrate having the metal layer is a plane having an off angle θ of more than 0°.

18. The substrate according to claim 13, wherein a surface of the underlying substrate having the metal layer is a plane having an off angle θ of more than 0°.

19. The substrate according to claim 14, wherein a surface of the underlying substrate having the metal layer is a plane having an off angle θ of more than 0°.

\* \* \* \* \*